United States Patent [19]

Maier et al.

[11] Patent Number: 5,151,656

[45] Date of Patent: Sep. 29, 1992

[54] CORRECTION OF NMR DATA ACQUIRED BY AN ECHO-PLANAR TECHNIQUE

[75] Inventors: Joseph K. Maier, Milwaukee; Robert M. Vavrek, Waukesha, both of Wis.; Gary H. Glover, Menlo Park, Calif.

[73] Assignee: General Electric Company, Milwaukee, Wis.

[21] Appl. No.: 625,733

[22] Filed: Dec. 11, 1990

[51] Int. Cl.$^5$ .................................................. G01R 33/20
[52] U.S. Cl. ..................................... 324/309; 324/307
[58] Field of Search ................ 324/307, 309, 306, 312

[56] References Cited

U.S. PATENT DOCUMENTS

| | | | |
|---|---|---|---|
| 4,355,282 | 10/1982 | Young et al. | 324/309 |
| 4,588,948 | 5/1986 | Mansfield | 324/309 |
| 4,628,262 | 12/1986 | Maudsley | 324/309 |
| 4,678,996 | 7/1987 | Haacke et al. | 324/309 |
| 4,701,706 | 10/1987 | Haake | 324/309 |
| 4,706,027 | 11/1987 | Hughes | 324/309 |
| 4,716,369 | 12/1987 | Sekihara et al. | 324/309 |
| 4,733,188 | 3/1988 | Sekihara et al. | 324/312 |
| 4,752,735 | 6/1988 | Onoderal et al. | 324/309 |
| 4,876,507 | 10/1989 | Van Vaals | 324/309 |
| 4,885,542 | 12/1989 | Yao et al. | 324/307 |
| 4,937,526 | 6/1990 | Ehman et al. | 324/309 |
| 4,999,581 | 3/1991 | Satoh | 324/309 |

OTHER PUBLICATIONS

"A New Phase Correction Method in NMR Imaging", Nalcioglu, C. B. and Cho, Z. H., Dept. Radiological Sciences, Div. Physics & Engineering University of California-Irvine, pp. 1446-1447.

"New Reconstruction Technique for Echo-Planar Imaging to Allow Combined Use of Odd and Even Numbered Echoes", Sekihara, K. and Kohno, H., *Magnetic Resonance in Medicine* 5, 485-491 (1987).

Primary Examiner—Michael J. Tokar
Assistant Examiner—Raymond Y. Mah
Attorney, Agent, or Firm—Quarles & Brady

[57] ABSTRACT

An image data set acquired by an NMR system using an echo-planar pulse sequence is corrected for systemic errors. Errors are measured by acquiring a reference data set using the same echo-planar pulse sequence without phase encoding, and the measured errors are employed to correct phase errors in the image data set.

8 Claims, 6 Drawing Sheets

CORRECTION OF NMR DATA ACQUIRED BY AN ECHO-PLANAR TECHNIQUE

BACKGROUND OF THE INVENTION

The field of the invention is nuclear magnetic resonance imaging methods and systems. More particularly, the invention relates to a method for producing NMR images using an echo-planar method.

Any nucleus which possesses a magnetic moment attempts to align itself with the direction of the magnetic field in which it is located. In doing so, however, the nucleus processes around this direction at a characteristic angular frequency (Larmor frequency) which is dependent on the strength of the magnetic field and on the properties of the specific nuclear species (the magnetogyric constant g of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*2}$$

The decay constant $1/T^*2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are typically performed in a cyclic manner in which the NMR measurement is repeated many times to accumulate different data during each cycle or to make the same measurement at different locations in the subject A wide variety of preparative excitation techniques are known which involve the application of one or more excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. One such pulse sequence is referred to in the art as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751-756 (1980). It employs a series of pulse sequences in which a variable amplitude phase encoding magnetic field gradient pulse is applied prior to the acquisition of each NMR spin-echo signal to phase encode spatial information into the signal in the direction of this gradient. In a two-dimensional implementation (2DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during each spin-echo acquisition encodes spatial information in the orthogonal direction. In a typical 2DFT data acquisition sequence, a series of pulse sequences, or views, are performed and the magnitude of the phase encoding gradient pulse $G_y$ is incremented ($G_y$) in the sequence of views to produce a set of NMR data from which an entire image can be reconstructed.

Conventional pulse sequences such as that just described produce excellent images, particularly when the subject is stationary. However, conventional scans typically require many pulse sequences which take several minutes to complete. During such a lengthy scan, the subject often moves due to fluid flow, respiration, peristalsis etc. and the reconstructed image is plagued with motion artifacts. The art is replete with methods for reducing motion artifacts or correcting NMR data to offset the effects of motion and flow.

The concept of acquiring NMR image data in a short time period has been known since 1977 when the echo-planar pulse sequence was proposed by Peter Mansfield (J. Phys. C. 10:L55–L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and there has been a long felt need for apparatus and methods with will enable EPI to be practiced in a clinical setting. Other echo-planar pulse sequences are disclosed in U.S. Pat. No(s). 4,678,996; 4,733,188; 4,716,369; 4,355,282; 4,588,948; and 4,752,735.

There are many difficulties in applying EPI methods. These include the need for large amplitude magnetic field gradient pulses, the need to rapidly switch such gradient pulses, the need to improve magnetic field homogeneity, and the need to improve the signal-to-noise ratio. While the distortions and image artifacts have been substantially reduced in EPI images by recently improved hardware, the phase errors in NMR data sets acquired with echo-planar methods continue to limit the clinical application of EPI.

SUMMARY OF THE INVENTION

The present invention relates to a method for correcting an NMR image data set which is acquired with an echo-planar pulse sequence, and particularly, to a method for correcting the phase errors in an EPI data set. The correction method includes: acquiring the EPI data set; acquiring a reference data set comprised of a plurality of rows of data which are produced using the same echo-planar pulse sequence used to acquire EPI data set, but without the application of a phase encoding gradient; Fourier transforming the rows of data in the reference data set to produce a transformed reference correction data set; calculating a et of phase corrections; Fourier transforming the EPI data set; correcting the transformed EPI data set using he set of phase corrections; and performing a second orthogonal Fourier transformation on the corrected EPI data set to produce an image data set.

A general object of the invention is to is to improve the quality of images produced using echo-planar pulse sequences. Many of the errors introduced into an EPI data set appear as phase errors. Since image reconstruction strategies employ the phase information to position the spins in the reconstructed image, phase errors can blur the image or produce ghosts and other distortion and shading artifacts. In accordance with the present invention, many of these phase errors can be separately determine by producing the reference data set using the same echo-planar pulse sequence used to produce the EPI data set. Without the phase encoding gradient applied, the Fourier transformation of the reference data set produces data from which the phase errors can be measured. These phase errors can be measured for each data point, or an average value can be determined for each row, or an average value can be determined for the even numbered rows and the odd numbered rows in the data set. The transformed EPI data set is then corrected by adding a correction phase to each data point or to each row of data points which offsets, or nullifies the measure phase error.

Another object of the invention is to provide higher order phase corrections to an EPI data set. After acquiring the reference data set, only a selected subset of the resulting array of data is Fourier transformed to produce the data from which the higher order phase errors re measured. This effectively filters out the high frequency variations before the data is used to correct the EPI data set.

The foregoing and other objects and advantages of the invention will appear from he following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
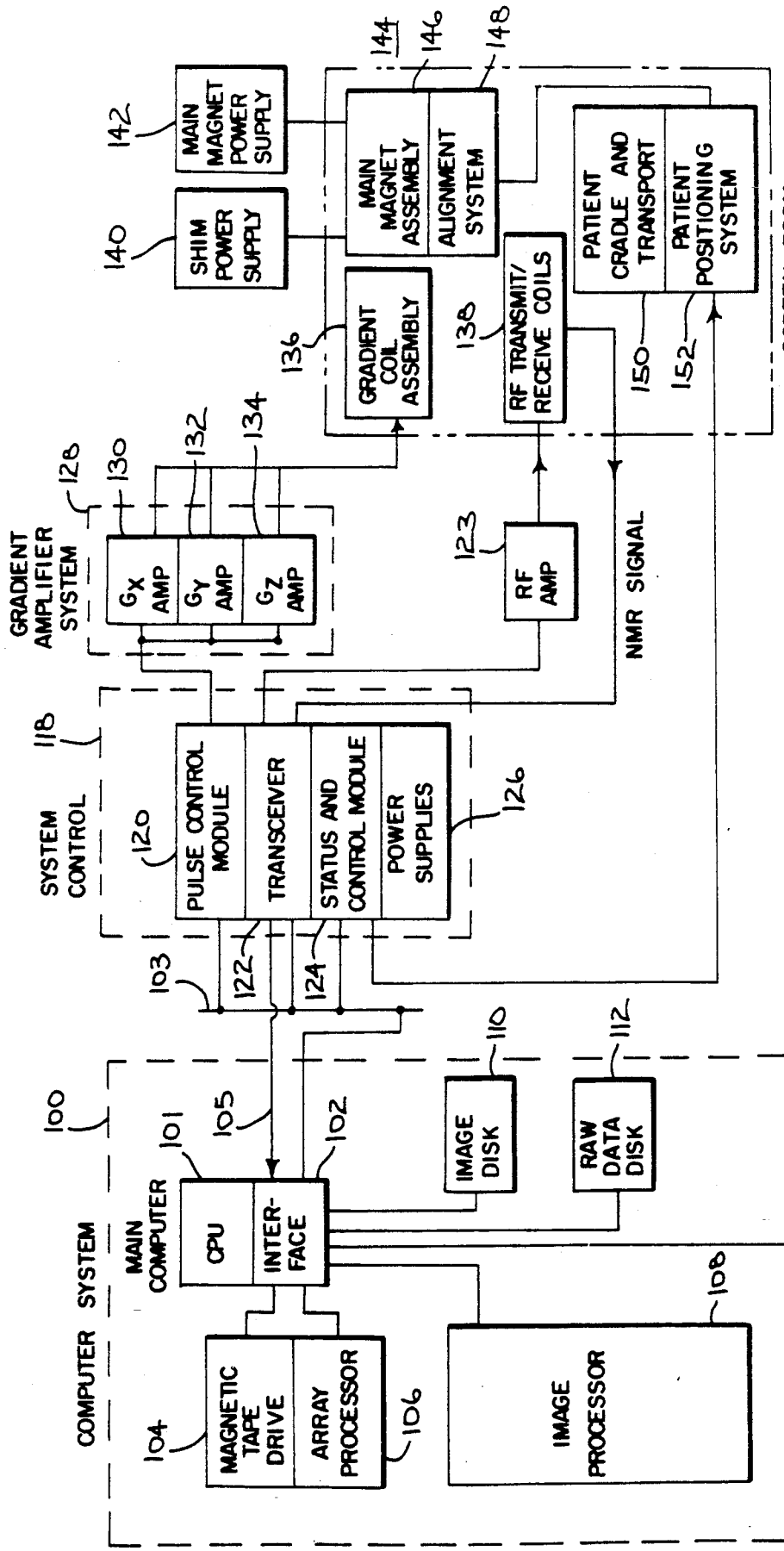
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a radiant amplifier system 128. Under the direction of stored program, the computer 100 communicates with system control 118 by means of a serial communication network 103 (such as the Ethernet network) in a manner well known to those skilled in the art. The system control 118 includes several subsystems such as a pulse control module (PC; 120, a radio frequency transceiver 122, a status control moule (SCM) 124, and power supplies generally designated 126. The PCM 120 utilizes control signals generated under program control by main computer 101 to generate digital waveform which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and more control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as one another by means of serial communications link 103.

The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
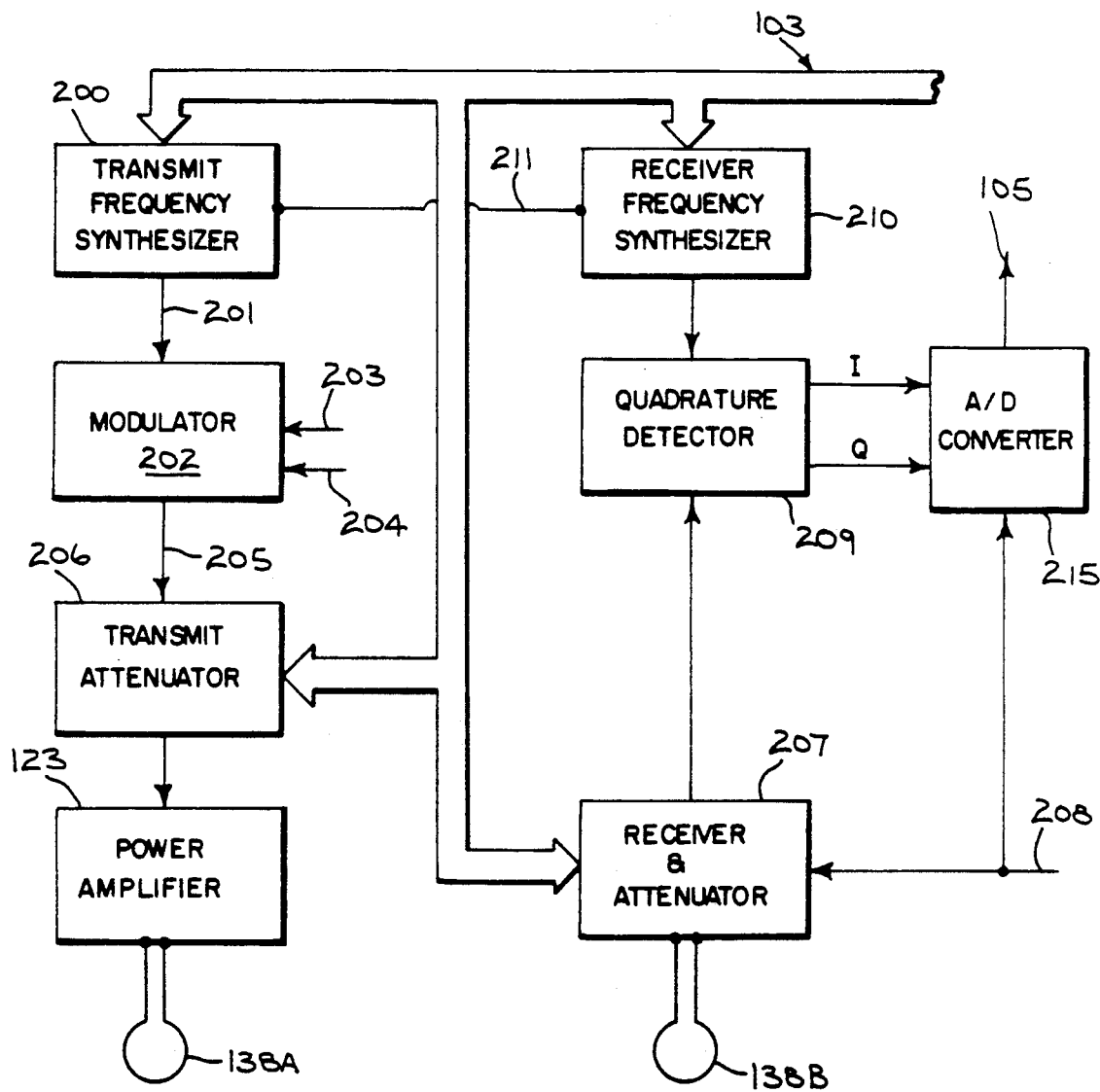
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate of 128 kHz to 1 MHz throughout the acquisition period. A set of 256 digital numbers are simultaneously acquired for each I and Q component of the NMR signal, and these digital numbers are conveyed to the main computer 101 through the serial link 105.

Figure 3A:
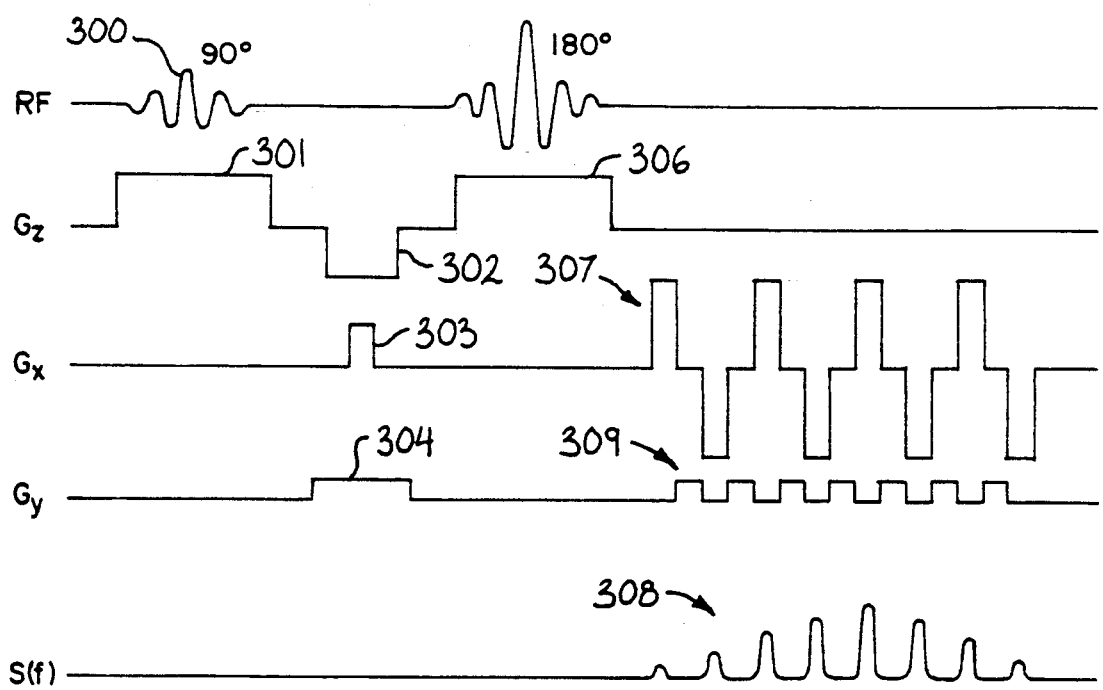
FIGS. 3A and 3B are exemplary echo-planar pulse sequences which may be used to practice the present invention.
Figure 3B:
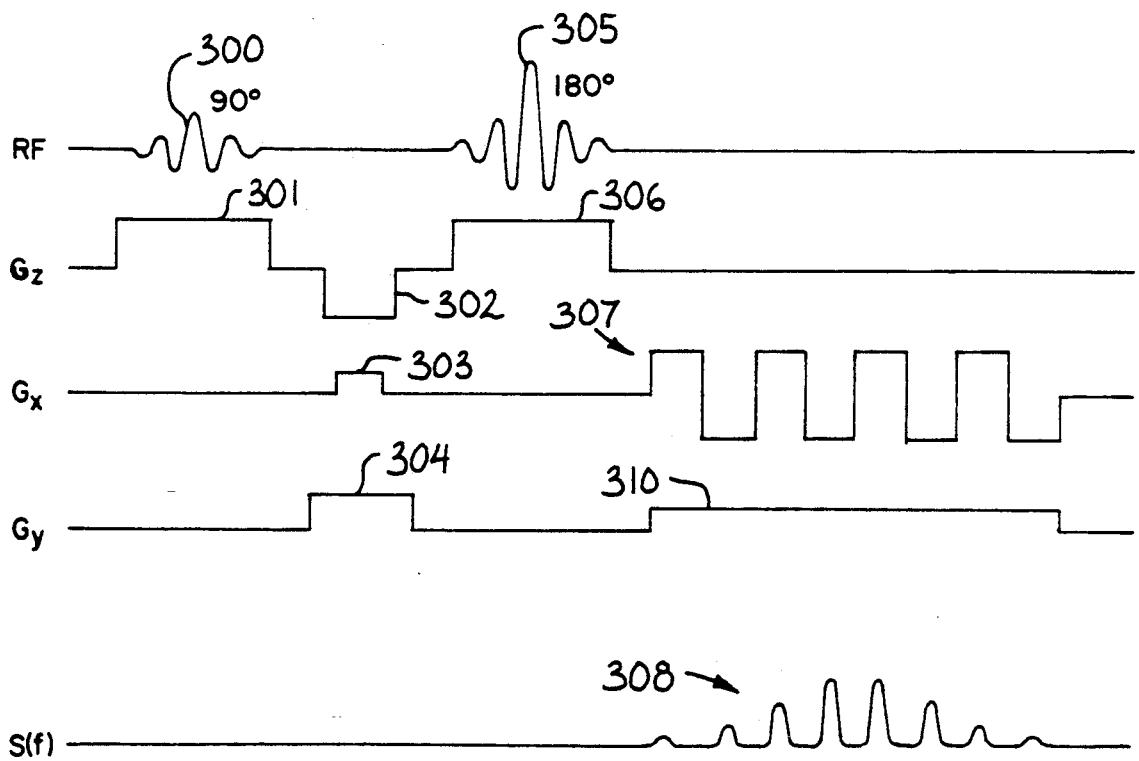

Referring particularly to FIGS. 3A and 3B, two different echo-planar pulse sequences which may be employed in the NMR system described above to practice the present invention are shown. Both employ a selective 90° RF excitation pulse 300 which is produced in the presence of a slice select $G_z$ gradient pulse 301 to excite spins in a selected slice through the subject. The $G_z$ gradient pulse 301 is followed by a $G_z$ rephasing pulse 302, which operates in the well known manner to rephase the excited spins in the selected slice so that the proper phase is restored for subsequent phase encoding Concurrently, a dephasing $G_x$ gradient pulse 303 is produced and a $G_y$ phase encoding pulse 304 is produced. The orientation of the transverse magnetization is then reversed by the application of a selective 180° RF excitation pulse 305 which is produced in the presence of a slice select $G_z$ gradient pulse 306. A series of NMR signals S(t) are then acquired by the application of a series of $G_x$ readout gradient pulses 307 which alternate in polarity to produce a corresponding series of gradient recalled echo signals 308.

In the pulse sequence of FIG. 3A the $G_x$ readout pulses 307 are spaced apart and small $G_y$ phase encoding pulses 309 are produced therebetween to separately phase encode each acquired gradient echo signal 308. There is a separate $G_x$ readout gradient pulse 307 and $G_y$ phase encoding pulse 309 for each view of data that is to be acquired. In the preferred embodiment 64 views are obtained during each pulse sequence and one pulse sequence is executed to acquire the views for the complete scan. It can be appreciated by those skilled in the art, however, that the number of views per pulse sequence and the number of pulse sequences per scan can be altered as desired.

In the pulse sequence of FIG. 3B there is minimal spacing between alternating $G_x$ readout pulses 307 and a single $G_y$ phase encoding pulse 310 is applied during the entire data acquisition interval. As with the embodiment of FIG. 3A, there is one $G_x$ readout pulse 307 and one resulting gradient echo signal 308 for each view of data to be acquired.

Figure 4A:
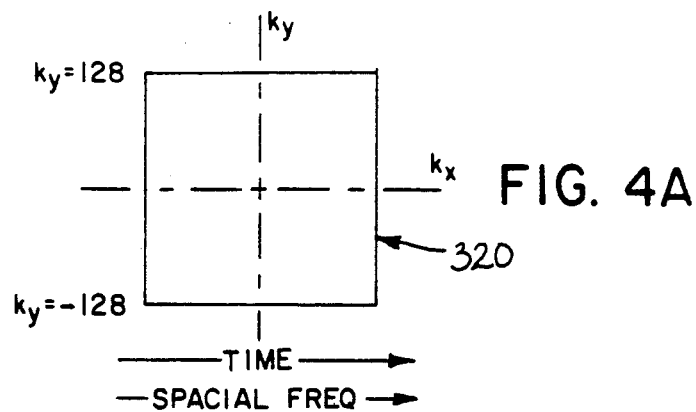
FIGS. 4A–4C are graphic representations of data structures which are produced when reconstructing an image from an echo-planar data set acquired with the system of FIG. 1.

Regardless of the echo-planar pulse sequence which is used, an array 320 of EPI data is acquired as shown in FIG. 4A. In the preferred embodiment, each gradient echo signal 308 is sampled at a rate of 128 to 1000 kHz to produce a row of 128 complex data points in the array 320. A total of 64 views are acquired, and accordingly, there are 64 rows of data stored in the array 320. Each row of complex data in the EPI data set 320 is acquired at a different phase encoding value (ky space) and each column of complex data is acquired at a different sampling time ($k_x$ space). If the echo-planar pulse sequence of FIG. 3B is employed, this EPI data must be corrected in the well known manner to offset the effect of a constantly changing phase encoding value during the data acquisition. In addition, the order in which the data is stored in the even rows of the EPI array 320 is reversed to offset the fact that the data for each even row is acquired with a negative $G_x$ readout gradient pulse rather than a positive $G_x$ readout gradient pulse.

Figure 4B:
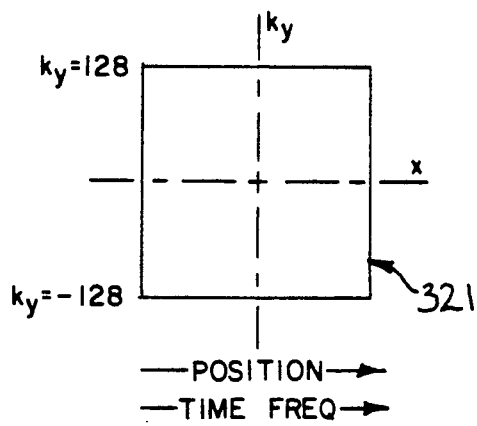
Figure 4C:
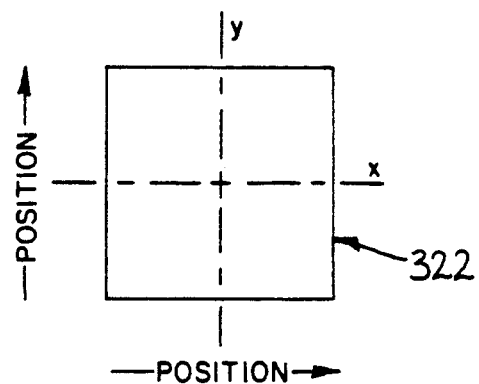

An image is produced from the acquired EPI data set 320 by performing a two-dimensional complex Fourier transform. The first Fourier transformation is performed on each row of the array 320 to produce a 64 by 128 element hybrid-space array 321 shown in FIG. 4B. Each row of data in the hybrid-space array 321 still represents a different phase encoding value (ky space), but each column of data now represents the signal at a particular spatial position along the x-axis, the read-out direction. A second complex Fourier transformation is then performed on each column of the hybrid-space array 321 to produce a 64 by 128 image array 322 shown in FIG. 4C. Each row of data in the image array 322 represents a particular spatial position along the phase encoding y axis, and each column represents a particular position along the readout x axis. Each element of the image array 322 indicates the real and imaginary components of the NMR signal which emanates from a particular location, or voxel, in the imaged slice. A conventional image is produced by setting the intensity of each pixel on a display at a value determined by the magnitude of the NMR signal at its corresponding location in the image array 322. This magnitude is calculated by finding the square root of the sum of the squares of the real and imaginary components of the data at each location in the image array 322.

The problem which is addressed by the present invention is that errors are introduced into the EPI data set 320 because of the manner in which it is acquired. These errors are primarily manifested as relative temporal shifts between adjacent rows of acquired data due to the errors in oscillating readout gradient, eddy currents and shim offsets. As a result, all data points in a given column of the EPI array 320 do not represent the same horizontal spatial frequency (i.e. location in $k_x$ space) as expected, and this is translated by the Fourier transformations into horizontal phase shifts in the horizontal direction of the reconstructed image. There may also be a linear phase error from row-to-row down each column of the EPI array 320 which may be translated by the reconstruction process into a shift in vertical position of objects. Higher order phase errors in both the row and column direction may also be present and cause blurring or distortion in the reconstructed image. The object of the present invention is to determine the errors present in the EPI data set 320 and to offset, or "unwrap" the errors before reconstructing an image.

Figure 5:
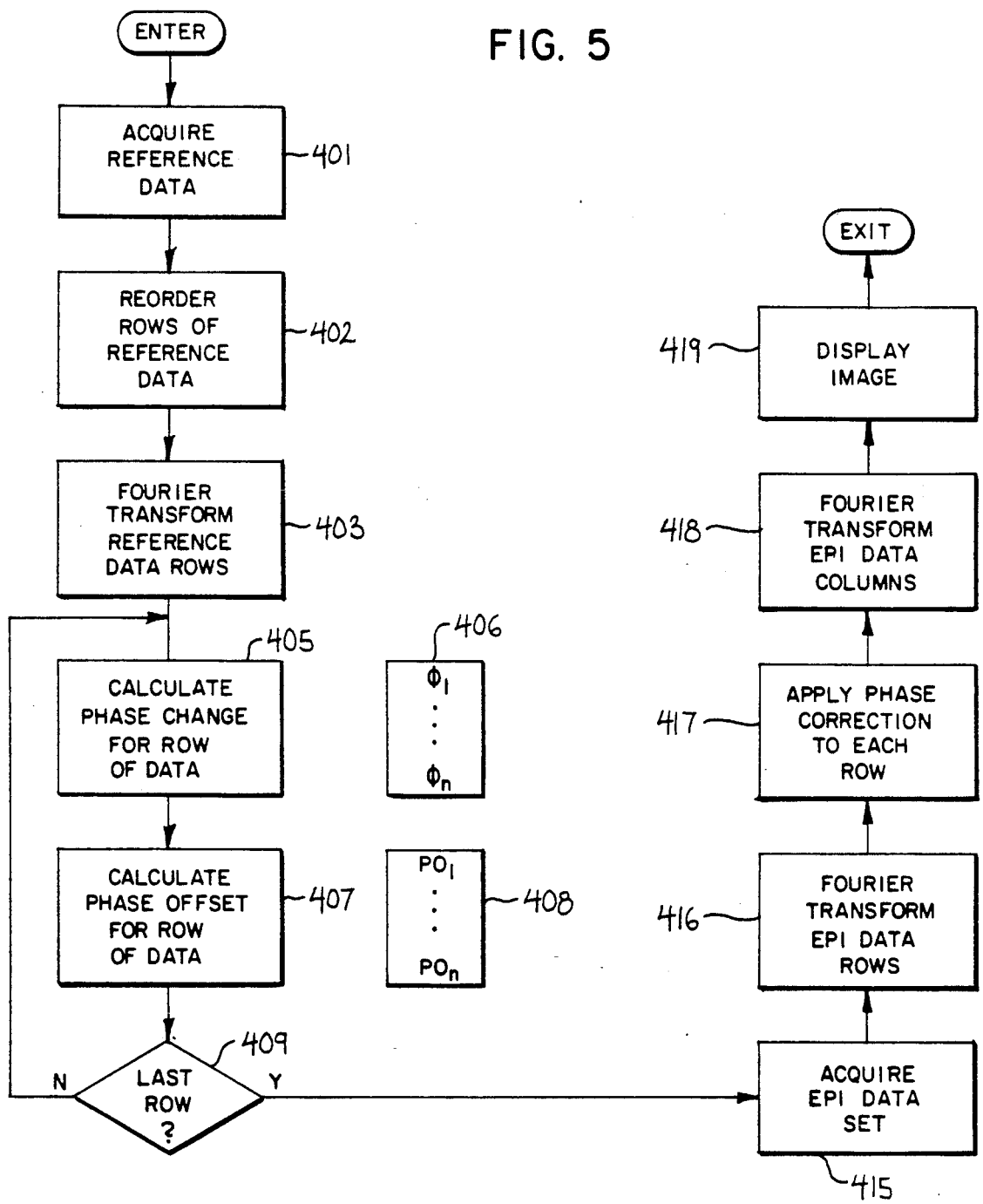
FIG. 5 is a flow chart of the program which is executed by the NMR system of FIG. 1 to carry out the present invention.

Referring particularly to FIGS. 1 and 5, the present invention is implemented by executing a program which is stored in the computer system 100 and which operates the NMR system to acquire and process the data necessary to reconstruct an image. The first step in the process is to acquire reference data as indicated by process block 401. The echo-planar pulse sequence of either FIG. 3A or 3B is used for this acquisition, however, the $G_y$ phase encoding gradient pulses are not produced. The samples taken and the number of views acquired are the same as those used to acquire the image data, which in the preferred embodiment results in a 64 by 128 array of complex numbers. Preferably, this reference data is acquired under the same measurement conditions as used to acquire the image data, although substantial improvement may also be achieved by performing the reference scan on a phantom or only occasionally as part of a calibration procedure.

As indicated by process block 402, the acquired reference data is corrected by reversing the order of the data stored on negative readout gradient rows of the data array and by subtracting any dc offset in the data by one of the well known methods. A one dimensional, complex, inverse Fourier transformation is then performed on each row of the acquired reference data as indicated by process block 403, and a loop is entered in which the phase angle of the elements in each transformed row is examined.

Figure 6:
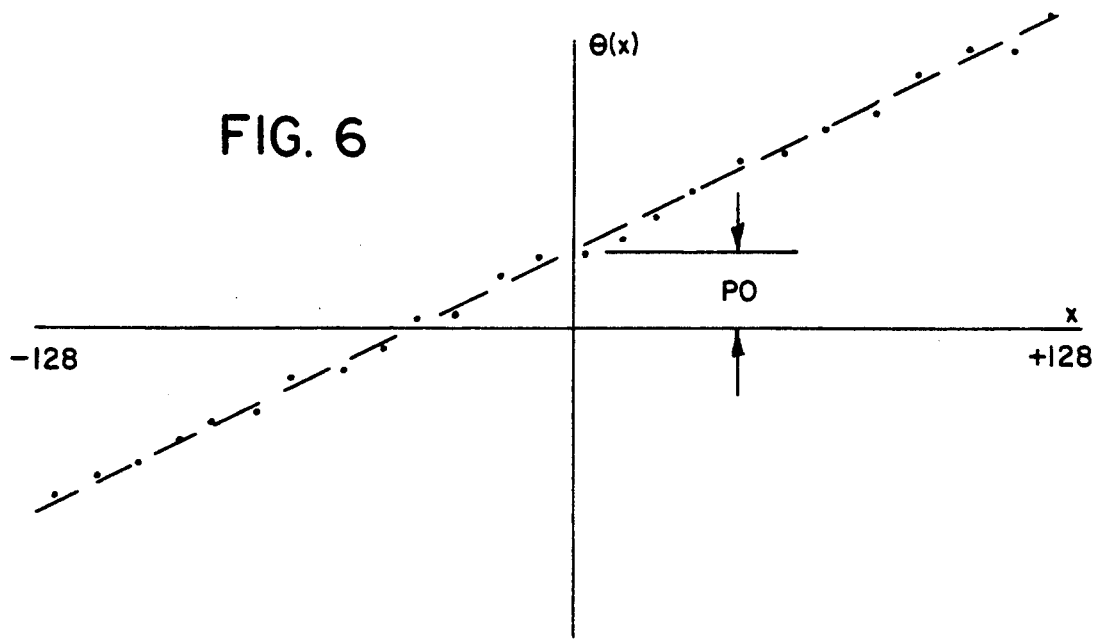
FIG. 6 is a graphic representation of the phase errors that are measured when practicing the present invention.

The phase angle ($\theta$) of a typical row of transformed reference data is illustrated n FIG. 6. If no errors existed in the EPI data, the phase angle should be zero along the entire extent of the x axis. Instead, the errors produce a changing phase, which to a first order approximation, lie along a straight line having a slope $\phi$ and an offset (PO). The correction values which are to be determined are phase angles which offset the phase errors $\theta$ at each value of x. Referring again to FIG. 5, this is achieved by first determining the slope $\phi_n$ of the straight line which passes through the nth row of measured phase angles as indicated at process block 405, and then calculating the phase offset (PO). The slope $\phi_n$ can be calculated in a number of ways, but the preferred method is that disclosed in 1986 in an Abstract in SMRM at pg. 1446 by C. B. Ahn, O. Nalcioglu, Z. H. Cho, entitled "A New Phase Correction Method In NMR Imaging." Each pair of adjacent points in a row (or surrounding neighborhood of points) is examined to determine if they meet a threshold value for consideration in the calculations. In the preferred embodiment a threshold value of 25% of the maximum value in the row containing the point is employed, and if either point in the pair (or neighborhood) fails to meet this threshold, it is ignored. If the data points meet the threshold requirement, the first point in the pair is multiplied by the conjugate of the second point (a complex multiplication), and the result is normalized by dividing it by the product of the magnitudes of the two data points. This process is repeated for each pair of points in the row, and each result is accumulated to form a complex sum. The normalization insures that each pair of points in the row contributes to this sum with equal weight, however, it should be apparent that some weighting as a function of component magnitudes may be desirable in some cases. An alternative method is to fit a straight line through the unwrapped phase value using a least squares fi method and then determine the slope of that line. Regardless of the method used, the slope, or linear phase change ($\phi$) is calculated for each row and stored in a phase correction array 406.

The phase offset ($PO_n$) for each row "n" of transformed reference data is then calculated as indicated at process block 407. This value is determined by finding the average value of all the angles $\theta$ in the row after removal of the phase angle $\phi_n$. That is, PO is determined by summing the angles of all data points which meet the 25% minimum and dividing the result by the number of included data points. This is repeated for each row and the values ar stored in an offset correction array 408.

After the last row of transformed reference data has been examined, as determined at decision block 409, all of the correction data has been calculated. It should be apparent that in the preferred embodiment a separate correction for each row of acquired data is calculated. This need not be the case. For example, a single correction for all the even rows and a single correction for all the odd rows would also be calculated and employed.

Referring again to FIG. 5, the EPI data set is now acquired at process block 415 using the pulse sequence of either FIG. 3A or 3B. In this case, of course, the $G_y$ phase encoding gradient pulses are applied so that a 64 by 128 array of EPI data from which an image can be reconstructed is acquired. As indicated at process block 416, one dimensional inverse Fourier transformation is then performed on each row of the EPI data set. The phase correction is then made to each row of the transformed EPI data set by subtracting the measured phase errors $\theta$ from each data point in the row. In the preferred embodiment the measured phase error at each data point is determined from the values f and PO in the arrays 406 and 407 as follows:

$$\theta_n(x) = (x)\phi_n + PO_n \quad (1)$$

The phase error n is subtracted from the phase of its corresponding data point in the transformed EPI data array as indicated at process block 417, and then a second inverse Fourier transformation is performed on each column of the corrected EPI data array as indicated at process block 418. The corrected and transformed EPI data set may now be used to produce a display image as indicated at process block 419. For example, the square root of the sm of the squares of the real and imaginary parts of each data point is calculated and used to produce an intensity value of a corresponding pixel in a raster memory. These intensity values are output to a CRT display and control the brightness of corresponding pixels on its screen.

Figure 7:
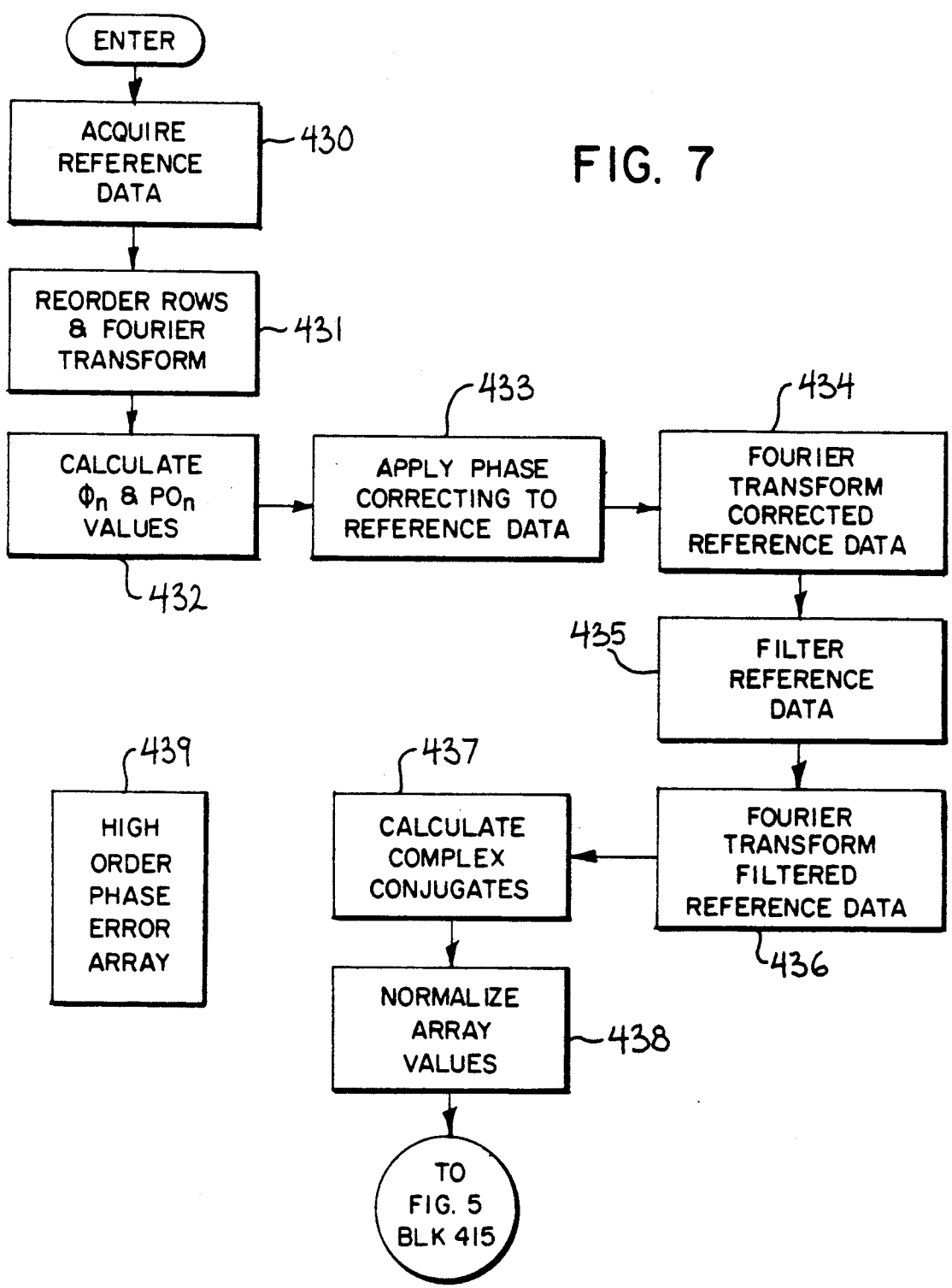
FIG. 7 is a flow chart of an alternative program executed by the NMR system of FIG. 1 to carry out the present invention.

An alternative embodiment of the invention employs the above-described process to make the first order corrections to each row of the acquired EPI data et, and in addition, it makes a correction to each element of he EPI data set for higher order phase errors. Referring particularly to FIG. 7, the early steps of the alternative process are the same as those described above and illustrated in FIG. 5. More particularly, a reference data set is acquired at process block 430 and its alternate rows are reversed in order and the entire 64 by 128 element array is inverse Fourier transformed along the row direction as indicate at process block 431. The arrays of phase change values $\phi_n$ and phase offset values $PO_n$ are then calculated t 432 as described above. At this point, the process deviates from the preferred embodiment described above.

As indicated at process block 433 in FIG. 7, the phase corrections $\phi_n$ and $PO_n$ are made first to the very reference data array that was used to calculate the phase corrections. This is accomplished as described above with respect to equation (1) by subtracting the total phase error $\theta_n$ from each element in the transformed reference data array. As indicated at process block 434, the corrected reference data is then Fourier transformed in the row direction back to "k space". The corrected reference data array no longer includes an indication of first order phase errors and it can be employed to determine the magnitude of higher order phase errors in the EPI data set.

However, before calculating the high order phase errors the corrected reference data set is filtered as indicated at process block 435. This is accomplished by setting the values in all but the 4 to 1 12 16 central columns of the 64 by 128 element corrected reference data array to zero. The filtered, corrected reference data array is the inverse Fourier transformed in the row direction as indicated at 436 to produce a 64 by 128 element array of complex numbers. The complex conjugate of each complex number in this array is then calculated at 437 and these values are the normalized at process 438 by dividing them by a complex number equal to the average value of the array elements. A 64 by 128 element high order phase error array 439 is thus produced.

Referring again to FIG. 5, the EPI data set is then acquired at process block 415 and is processed as described above with one exception. When the phase corrections are made to the EPI data set at process block 417, both the first order corrections and the higher order corrections are made to each element. The first order corrections ar made as described above with respect to equation (1) and then each element of the EPI data set is complex multiplied by the corresponding element in the high order phase error array 439. The corrected EPI data set is then Fourier transformed in the column direction and used to produce a display.

We claim:

1. A method for correcting phase errors produced by an NMR system during the acquisition of an NMR image data array using an echo-planar pulse sequence, the steps comprising:
   a) acquiring the NMR image data array with the NMR system using an echo-planar pulse sequence which applies a different phase encoding magnetic filed gradient for each row of acquired NMR image data in the array;
   b) acquiring an array of complex NMR reference data with the NMR system using the same echo-planar pulse sequence, but with the phase encoding magnetic field gradient set to substantially zero during the acquisition of the entire array of complex NMR reference data;
   c) Fourier transforming each row of the array of complex NMR reference data to produce an array of complex transformed reference data;
   d) calculating a set of phase errors by determining the relative phase of data in each row of the array of complex transformed reference data;
   e) Fourier transforming each row of the array of complex NMR image data to produce an array of complex transformed NMR image data;
   f) correcting the complex transformed NMR image data by altering the phase of complex values therein as a function of the set of calculated phase errors;
   g) Fourier transforming each column of the array of corrected, complex, transformed NMR image data to produce an array of display data; and
   H) displaying the array of display data to produce an image.

2. The method as recited in claim 1 in which the set of calculated phase errors includes a separate phase error value for each row of the array of complex transformed reference data, and the complex values in each row of the complex transformed NMR image data is altred as a function of the phase error value for the corresponding row in the array of complex transformed reference data.

3. The method as recited in claim 1 in which the complex values of data points surrounding a central region in the array of complex NMR reference data are set to zero before Fourier transforming each of the rows in said array of complex NMR reference data.

4. The method as recited in claim 1 in which the set of phase errors are calculated by:
   calculating a phase change ($\phi$) for each row in the array of complex transformed reference data; and
   calculating a phase offset (PO) for each row in the array of complex transformed reference data.

5. The method as recited in claim 4 in which each phase change ($\phi$) indicates the linearized rate of change of phase of the complex data points in a row of complex transformed reference data, and the phase offset (PO) indicates the average phase of the complex data points in said row.

6. The method as recited in claim 4 in which the complex transformed NMR image data is corrected by altering the phase of the complex values in each row thereof with the phase change ($\phi$) and the phase offset (PO) calculated for the corresponding row of the array of complex transformed reference data.

7. The method as recited in claim 6 in which the phase of the complex values in a row of the complex transformed NMR image data is altered by subtracting from the phase of each complex data point an amount equal to the phase offset (PO) and an amount equal to the phase change ($\phi$) multiplied by a number indicative of the location of the complex data point in the row of complex transformed NMR image data.

8. The method as recited in claim 1 in which the set of phase errors are calculated by:
   a) calculating a first order phase correction from the complex transformed reference data which form one component of the phase errors;
   b) subtracting the first order phase corrections from the complex transformed reference data;
   c) Fourier transforming each row of the corrected complex transformed reference data to produce an array of corrected complex reference data;
   d) filtering the corrected complex reference data array by setting selected ones of its elements to zero and Fourier transforming each row of the array to produce a correction array of complex numbers; and
   e) calculating the complex conjugate of each element in the correction array to produce an array of high order phase errors that form a second component of the phase errors.

* * * * *